United States Patent
Teggatz et al.

(10) Patent No.: US 6,476,667 B1
(45) Date of Patent: Nov. 5, 2002

(54) ADJUSTABLE CURRENT LIMITING/SENSING CIRCUITRY AND METHOD

(75) Inventors: Ross Elliot Teggatz; Joseph Allen Devore, both of Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/959,959

(22) Filed: Oct. 24, 1997

Related U.S. Application Data

(63) Continuation of application No. 08/655,658, filed on Jun. 3, 1996, now abandoned, which is a continuation of application No. 08/447,284, filed on May 22, 1995, now abandoned, which is a continuation of application No. 08/145,285, filed on Oct. 29, 1993, now abandoned.

(51) Int. Cl.[7] .............................. G05F 1/10; G05F 3/02
(52) U.S. Cl. ........................ 327/538; 327/543; 327/427
(58) Field of Search ................................ 327/427, 430, 327/431, 432, 433, 434, 538, 542, 543

(56) References Cited

U.S. PATENT DOCUMENTS

| | | | | |
|---|---|---|---|---|
| 4,068,134 A | * | 1/1978 | Tobey, Jr. et al. | 327/531 |
| 4,746,810 A | * | 5/1988 | Takahashi | 307/350 |
| 4,763,021 A | * | 8/1988 | Stickel | 307/475 |
| 4,791,326 A | * | 12/1988 | Vajdic et al. | 307/571 |
| 5,075,677 A | * | 12/1991 | Meaney et al. | 307/577 |
| 5,079,456 A | * | 1/1992 | Kotowski et al. | 307/571 |
| 5,172,018 A | * | 12/1992 | Colandrea et al. | 307/296.6 |
| 5,187,387 A | * | 2/1993 | Kawauchi | 307/362 |
| 5,339,078 A | * | 8/1994 | Vernon | 307/571 |
| 5,422,593 A | * | 6/1995 | Fujihira | 330/254 |

OTHER PUBLICATIONS

Vol. 4, Field Effect Devices, Robert F. Pierret, Modular Series on Solid State Devices, 1990.*
Electronic Circuits: Discrete and Integrated, Donald L. Schilling, 1989; pp. 145–160.*

* cited by examiner

Primary Examiner—Tuan T. Lam
(74) Attorney, Agent, or Firm—W. Daniel Swayze, Jr.; W. James Brady; Frederick J. Telecky, Jr.

(57) ABSTRACT

A circuit and method are provided for accurate and adjustable current limiting/sensing in a power IC (100). In particular, a current limiting/sensing circuit (110) and method of use are provided that substitutes a transistor ($MD_2$) in place of a resistor. Consequently, all of the components ($MD_1$, $MD_2$, $MD_{out}$) in the IC (100) may be identical transistors, which may be fabricated by one process and integrated in one power structure. Therefore, process variations from device to device and errors due to thermal gradients between components may be minimized, thereby reducing the complexity and fabrication costs of the power ICs. Additionally, a user may readily adjust the trip/sensing point of the current limiting circuit (110) without having to physically alter individual components in the IC (100).

2 Claims, 2 Drawing Sheets

ADJUSTABLE CURRENT LIMITING/ SENSING CIRCUITRY AND METHOD

This application is a Continuation, of application Ser. No. 08/655,658, filed Jun. 3, 1996 now abandoned, and is a Continuation of Ser. No. 08/447,284, filed May 22, 1995 now abandoned, and is Continuation of Ser. No. 08/145,285 filed Oct. 29, 1995 now abandoned.

TECHNICAL FIELD OF THE INVENTION

This invention relates generally to electronic circuits, and more particularly, to an adjustable current limiting/sensing circuit and method of using same.

BACKGROUND OF THE INVENTION

In designing semiconductor power integrated circuits (ICs), it is often prudent to include limiting/sensing circuitry to monitor and, if necessary, control the IC's output current or current flowing through the circuit. For example, current limiting/sensing circuitry may be provided to monitor and control the output current of high or low power IC switches or amplifiers. Also, current limiting/sensing circuitry may be used in an IC for fault protection, such as, for example, in detecting internal or external short circuits. In such an application, whenever an excessive amount of current is detected flowing either in the IC or through its output structure, the current limiting/sensing circuit may be designed to "trip" and turn the IC, or if desired, any associated circuitry "off".

Using a typical design for a current limiting/sensing circuit in an IC, a portion of the output current to be monitored is passed through a resistor. A voltage drop is developed across the resistor, which is proportional to the output current. Consequently, as the IC's output current is increased, the current through the resistor is increased, which increases the voltage drop across the resistor. Conversely, as the output current is decreased, the voltage drop across the resistor is accordingly decreased. Therefore, by monitoring the voltage drop across the resistor, the IC's output current may be monitored and thereby controlled, if so desired.

FIG. 1 shows a typical semiconductor power IC design that includes a current sensing circuit having a FET arranged in combination with a diffusion or poly-silicon resistor to form a voltage divider. With an appropriate signal applied to the GATE IN input lead, IC 10 will conduct or be turned "on". Current $I_1$ passes through sensing transistor $MD_1$ and resistor $R_1$, while current $I_2$ passes through output transistor $MD_{out}$. Current $I_1$ is proportional to current $I_2$, as defined by the width/length (w/l) ratio of $MD_1$ to the w/l ratio of $MD_{out}$. In general, current $I_1$ is much smaller than current $I_2$ (e.g., 500:1 or greater). The voltage developed at node 4, with respect to "ground", varies proportionally with the output current $I_{out}$. However, a problem exists in manufacturing circuits such as IC 10, because the transistors and resistors are fabricated by different processes. For example, the transistors may be fabricated as double-diffused MOS (DMOS) devices, while the resistors may be fabricated by a separate, diffusion process. Consequently, these process variations between components typically cause significant deviations in the trip/sensing levels experienced from IC to IC. Furthermore, since the performance characteristics of the components in each IC are somewhat process dependent, thermal gradients often occur between the components that contribute to the trip/sensing level errors. Therefore, accurate (i.e., reduced error) current limiting/sensing circuits are difficult to fabricate and implement in power and similar ICs.

Additionally, in order to change a trip/sensing level in a typical IC, a user must change one or more of the components' values. For example, due to the above-described process variations, if a user requires a specific trip/sensing voltage $V_{limit-out}$ to represent a specific output current $I_{out}$ in IC 10, either the IC would have to be custom made to provide the specific values (thereby increasing fabrication costs), or the user would have to be afforded the option of changing the trip/sensing level for each IC. However, in order for a user to change the trip/sensing level of IC 10 in FIG. 1, either the value of resistor $R_1$ or the gain ratio of transistors $MD_1$ and $MD_{out}$ would have to be changed. Consequently, to facilitate such changes, a user may be given the option of changing the metal leads mask of the IC, or activating poly-fuses or zener zap circuits incorporated in the IC during fabrication. Such limited flexibility increases the complexity and fabrication costs of the IC. Therefore, given the errors introduced into current limiting/sensing circuits due to process variations and thermal gradients, and the relative inflexibility of their design, accurate (i.e, reduced errors) limiting/sensing circuits are difficult to fabricate and implement in power and similar ICs.

SUMMARY OF THE INVENTION

Accordingly, a need exists in the integrated circuit manufacturing industry for an accurate, adjustable current limiting/sensing circuit. In accordance with the present invention, a method and circuitry are provided for accurate and adjustable current limiting/sensing in a power or similar IC. In particular, a current limiting/sensing circuit and method of use may be provided that substitutes a transistor in place of a resistor or similarly "nonadjustable" component. Consequently, all of the critical components in the IC may be fabricated by one process and integrated in one power structure.

An important technical advantage of the present invention is that errors due to process variations and thermal gradients may be minimized using identical components fabricated by one process and integrated into one power output structure. Another important technical advantage of the present invention is that the current trip/sensing level of the IC may be adjusted by applying an appropriate gate voltage to the substituted transistor. Consequently, the adjustable, current limiting/sensing circuit of the present invention is significantly more accurate and flexible than existing current limiting/sensing circuits.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The preferred embodiment of the present invention and its advantages are best understood by referring to FIGS. 2–7 of the drawings, like numerals being used for like and corresponding parts of the various drawings.

Figure 1:
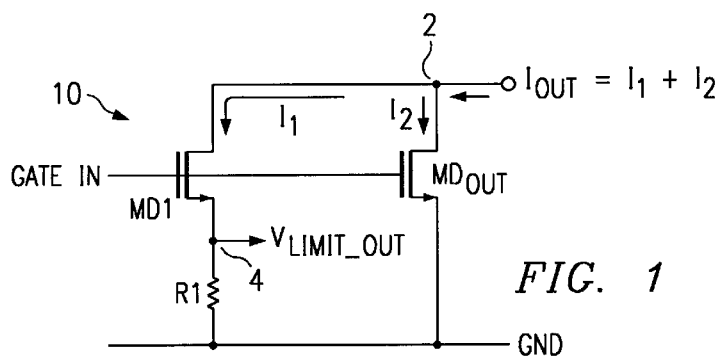
FIG. 1 illustrates an electrical schematic circuit diagram of a typical current limiting/sensing circuit in a power IC.
Figure 2:
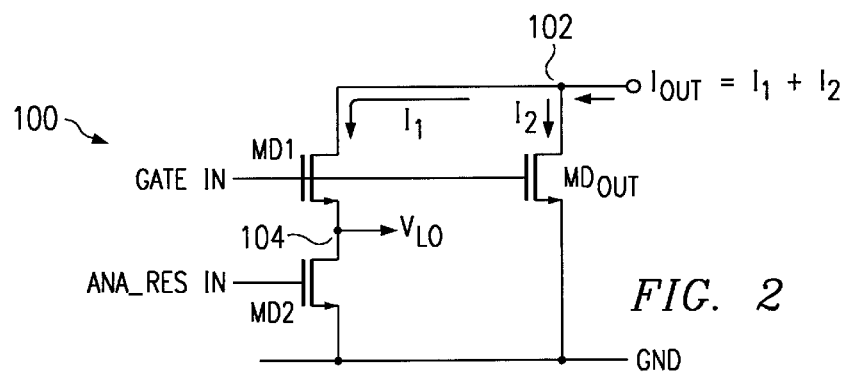
FIG. 2 illustrates an electrical schematic circuit diagram of a preferred embodiment of an adjustable current limiting/sensing circuit according to the teachings of the present invention.

FIG. 2 illustrates an electrical schematic circuit diagram of a preferred embodiment of an adjustable current limiting/sensing circuit arranged in a power IC according to the teachings of the present invention. In IC 100, the drains of transistors $MD_1$ and $MD_{out}$ are connected together and also to node 102. The current limiting control input (GATE IN) is connected to the gates of transistors $MD_1$ and $MD_{out}$, and the adjustable gate input (ANA_RES IN) is connected to the gate of transistor $MD_2$. The gate of $MD_2$ may be connected to an external pin of IC 100, in order to provide a user with direct control over the conduction of $MD_2$. In a preferred embodiment, transistors $MD_1$, $MD_2$ and $MD_{out}$ may be fabricated as FETs in one process as an LDMOS structure. However, the concept of the invention is not intended to be so limited to a specific process or structure. The source of transistor $MD_1$ is connected to the drain of transistor $MD_2$ and also to node 104. Voltage $V_{LO}$ developed at node 104 represents the adjustable trip/sensing level of IC 100. The sources of transistors $MD_2$ and $MD_{out}$ are connected to circuit "ground". In actuality, for design purposes, circuit "ground" may be at a voltage level other than zero volts. Essentially, since all of the transistors in FIG. 2 may be fabricated as identical structures by one process, and integrated in one structure, the process variations and thermal gradients that afflicted earlier current limiting/sensing circuits are virtually eliminated by the present invention. Furthermore, by substituting transistor $MD_2$ for a resistor, the trip/sense level of circuit 100 is made readily adjustable.

Figure 3:
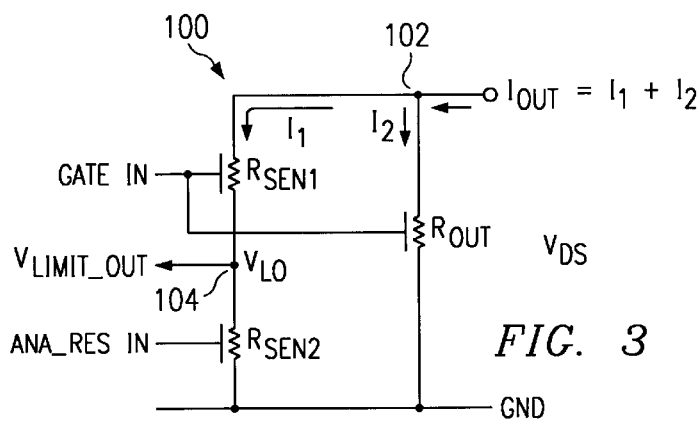
FIG. 3 illustrates an equivalent electrical circuit diagram for the adjustable current limiting/sensing circuit of FIG. 2.

FIG. 3 is an equivalent electrical circuit diagram of the adjustable current limiting/sensing circuit shown in FIG. 2. Essentially, resistors $R_{sen1}$, $R_{sen2}$ and $R_{out}$ represent equivalent resistive circuits for respective transistors $MD_1$, $MD_2$ and $MD_{out}$ when each of the transistors is operating in the MOSFET linear region (e.g., $V_{GS} \gg V_{DS}$). In operation, an appropriate analog voltage may be applied via the GATE IN input lead to turn on transistors $MD_1$, $MD_{out}$ and IC 100. The magnitude of the input gate is selected so that the $V_{DS}$ of each of transistors $MD_1$ and $MD_{out}$ is low enough that they may operate in the linear region of the MOSFET curve. Another analog voltage may be applied via the ANA_RES IN input lead to turn on transistor $MD_2$, and also keep its $V_{DS}$ low enough to assure linear operation. With the three transistors conducting, output current $I_{out}$ flows in parallel paths through the sensing structure of IC 100 as current $I_1$ and the output structure of the device as current $I_2$. Consequently, the trip/sensing level voltage $V_{LO}$ developed across $R_{sen2}$ ($MD_2$) is given by the following equation:

$$V_{LO} = (R_{sen2}/(R_{sen1} + R_{sen2})) * V_{DS} \quad (1)$$

where $V_{DS} = I_2 * R_{out}$. Therefore, as demonstrated by equation 1, by varying the input gate voltage ANA_RES IN, the equivalent resistive value of $R_{sen2}$ may be adjusted to set the trip/sensing level of IC 100. In other words, transistor $MD_2$ may be adjusted to provide a desired $V_{LO}$ out for a specific value of $I_{out}$. Consequently, in accordance with the present invention, the user may readily adjust the trip/sensing level of IC 100. In response to detecting a desired $V_{LO}$, as described in detail below, the user may then control the signal applied to the GATE IN input lead to turn off or reduce the analog voltage applied to $MD_1$, $MD_{out}$ and IC 100.

Figure 4:
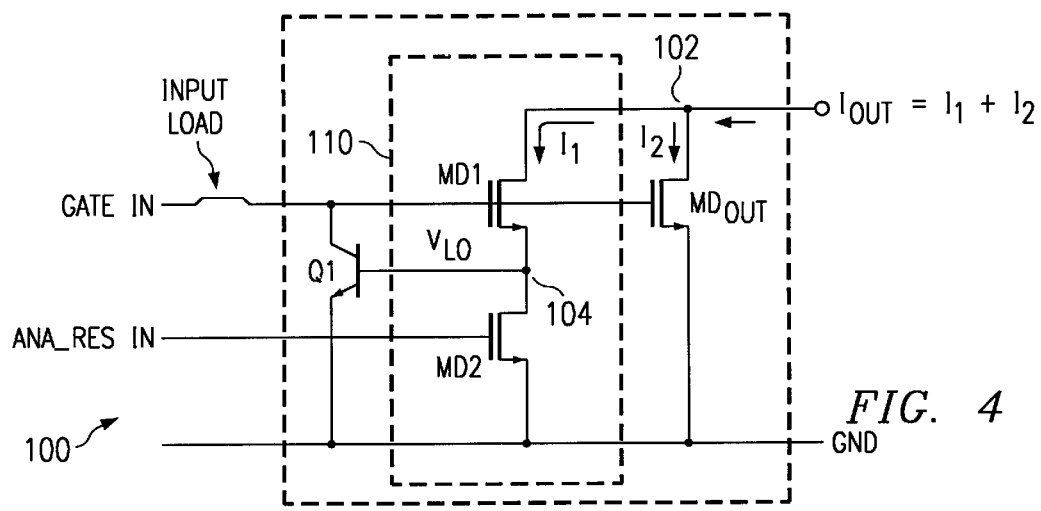
FIG. 4 illustrates an electrical schematic circuit diagram of a second embodiment of an adjustable current limiting/sensing circuit according to the teachings of the present invention.

FIG. 4 illustrates a second embodiment of an adjustable current limiting/sensing circuit according to the teachings of the present invention. In IC 100 of FIG. 4, adjustable current limiting/sensing circuit 110 may be operated in conjunction with transistor $Q_1$, arranged as a common emitter amplifier, to "trip" at a predetermined value of voltage $V_{LO}$ and thereby limit output current $I_{out}$ from IC 100 to a predetermined value. The collector of NPN transistor $Q_1$ is connected to the GATE IN input lead of circuit 110 and also to the gates of transistors $MD_1$ and $MD_{out}$, and the emitter of $Q_1$ is connected to circuit "ground". The base of $Q_1$ is connected to node 104. As described above with respect to FIGS. 2 and 3, the GATE IN input voltage may be applied to turn on IC 100, and the ANA_RES IN input voltage may be applied to adjust the trip point of current limiting/sensing circuit 110. The characteristics of transistor $Q_1$ are such that IC 100 turns on when the $V_{BE}$ of $Q_1$ reaches a $V_{BE}$ (ON) value. In order to generate the $V_{BE}$ (ON) required to turn on IC 100, a sufficient current must flow through $MD_2$. A drain-to-source voltage drop is then generated across $MD_2$, which is defined as the product of the current flowing through $MD_2$ and the MOS equivalent drain-to-source resistance ($R_{DS(on)}$). The $R_{DS(on)}$ of $MD_2$ may be varied by adjusting the gate/source voltage of $MD_2$, as defined by the ANA_RES IN input voltage. Consequently, if current $I_1$ increases due to the $V_{BE(ON)}$ requirement of Q1, then it follows that the output current $I_{out}$ will also increase. By so arranging $Q_1$ in conjunction with IC 100, and varying the ANA_RES IN input voltage accordingly, current limiting/sensing circuit 110 may be set to trip "on" or "off" at relatively higher or lower current level trip points, depending on the analog voltage level applied to the ANA_RES IN input line.

Figure 5:
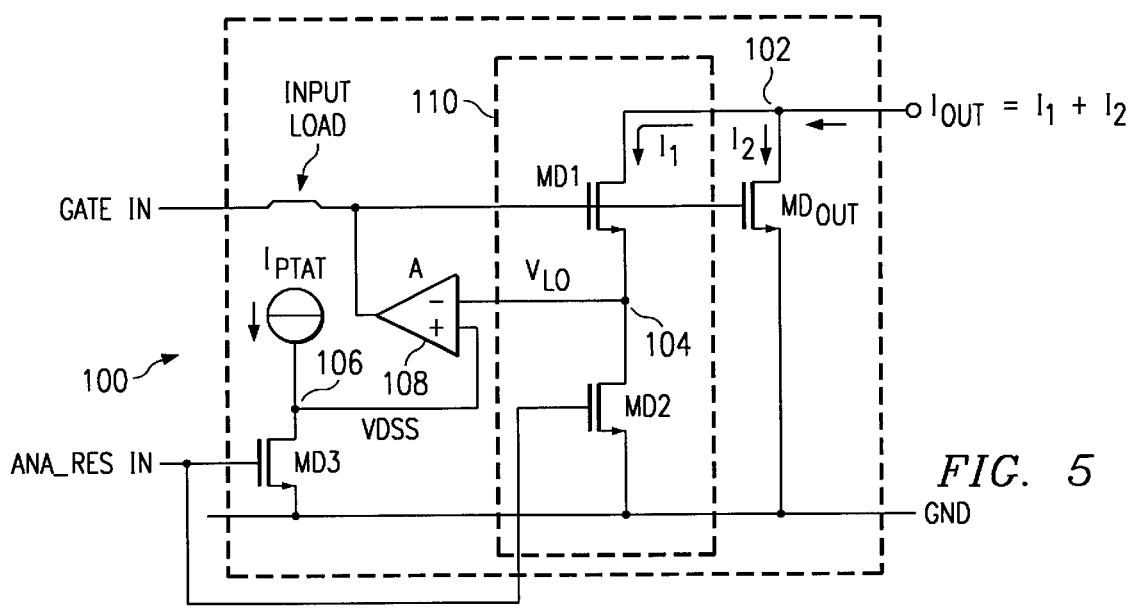
FIG. 5 illustrates an electrical schematic diagram of a third embodiment of the present invention.

FIG. 5 illustrates a third embodiment of the present invention. In IC 100 of FIG. 5, adjustable current limiting/sensing circuit 110 may be used in conjunction with a comparator circuit to compare trip/sensing (i.e., set point) voltage $V_{LO}$ developed at node 104, with a reference parameter, such as, for example, a particular setting of current source $I_{ptat}$. The output of comparator amplifier 108 is connected to the GATE IN input lead of circuit 100, and the negative signal input of amplifier 108 is connected to node 104. Reference current source $I_{ptat}$ is connected to node 106, which is also connected to the drain of transistor $MD_3$ and the positive signal input of amplifier 108. The source of transistor $MD_3$ is connected to circuit "ground", and the gate of $MD_3$ is connected to the ANA_RES IN input lead of current limiting/sensing circuit 110. Consequently, current source $I_{ptat}$ may be adjusted to a predetermined setting that represents a desired current reference value such as, for example, a desired temperature coefficient.

In operation, when transistor $MD_3$ is turned on by applying an appropriate voltage at the ANA_RES IN input lead, reference current $I_{ptat}$ flows through $MD_3$. The $V_{DS}$ of transistor $MD_3$ ($V_{DS3}$), which is developed at node 106, is coupled to the positive signal input of amplifier 108, where it is compared with the trip/sensing limit voltage $V_{LO}$ developed at node 104. When $V_{DS3}$ is equal to $V_{LO}$, a signal is output from amplifier 108 and coupled to the gates of $MD_1$ and $MD_{out}$. Consequently, adjustable current limiting/sensing circuit 110 of IC 100 may be set to trip ON at the desired current, which varies as defined by the thermal coefficient set by current source $I_{ptat}$.

Figure 6:
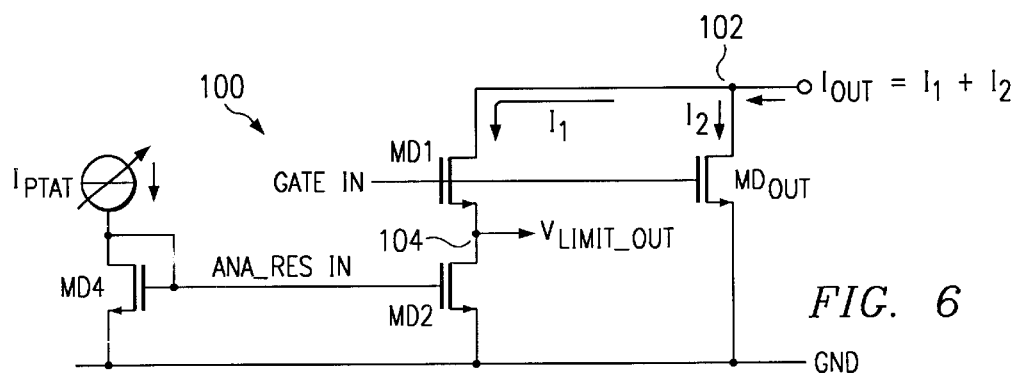
FIG. 6 illustrates a first exemplary biasing technique for use with the present invention.
Figure 7:
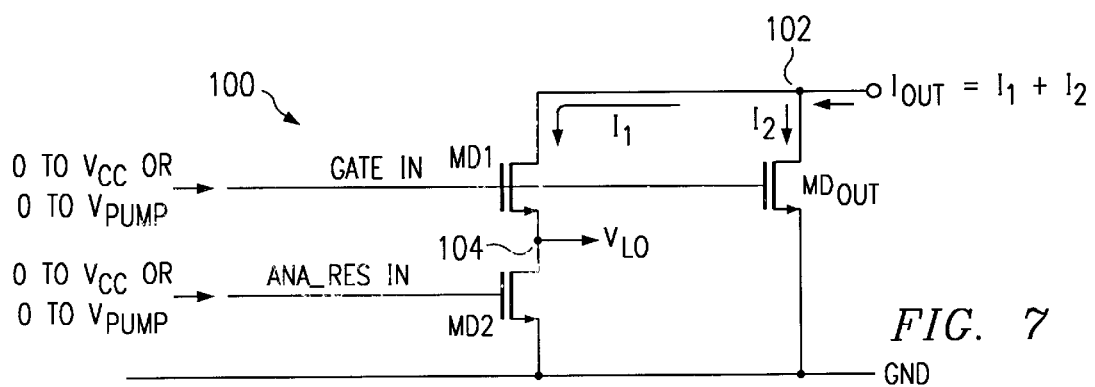
FIG. 7 illustrates a second exemplary biasing technique for use with the present invention.

FIGS. 6 and 7 are electrical schematic circuit diagrams that illustrate exemplary biasing techniques that may be used to provide added flexibility in using the present invention. Referring to FIG. 6, an adjustable current source $I_{ptat}$ may be connected to the drain of transistor $MD_4$, which is shorted to its gate. Transistor $MD_4$ may be fabricated by the same process used to form the other transistors in IC 100, thereby minimizing process variations and thermal gradients in accordance with the teachings of the invention. The gate of $MD_4$ is connected to the gate of $MD_2$, and the source of $MD_4$ is connected to "ground". By adjusting $I_{ptat}$ accordingly, a voltage may be applied to the gate of $MD_2$ that causes $MD_2$ to conduct and thereby provide a desired $V_{DS}$ for $MD_2$ and, therefore, a desired $V_{LO}$ trip/sensing level for a given $I_{out}$ value. Alternatively, referring to FIG. 7, transistors $MD_1$, $MD_2$ and $MD_{out}$ may all be tied to the same gate voltage. The desired $V_{LO}$ trip/sensing level for a given $I_{out}$ value may be obtained by the channel width variation between $MD_1$ and $MD_2$. Because $MD_1$, $MD_2$ and $MD_{out}$ are all operating in the linear region, a linear relationship between their associated channel width may be obtained. Consequently, a method and structure for providing a process-independent $V_{LO}$ trip/sensing level for a given $I_{out}$ value is achieved with the present invention. In addition, transistors $MD_1$ and $MD_2$ may be integrated into the device $MD_{out}$, which is often a large structure for power applications. Consequently, the present invention provides a technique for minimizing any thermal gradient effects that may be generated by transistor $MD_{out}$.

Although the present invention and its advantages have been described in detail, it should be understood that various changes, substitutions and alterations can be made herein without departing from the spirit and scope of the invention as defined by the appended claims.

What is claimed is:

1. An adjustable current limiting/sensing circuit comprising:

an output circuit operable to generate a variable output current, said output circuit responsive to a first input signal;

a first input circuit connected to said output circuit and operable to generate a sense current, said first input circuit responsive to said first input signal;

a second input transistor connected to said first input circuit and operable to generate a sensing voltage proportional to said sense current, said second input transistor responsive to a second input signal; and a third input transistor having an emitter of the third input transistor directly connected to a source/drain of said second input transistor, a collector of the third input transistor directly connected to an input of said first input circuit, and an input of said output circuit, said third input transistor being operable to switch responsive to said sensing voltage applied to an input of the third input transistor and thereby vary the variable output current of said output circuit responsive to said second input signal.

2. The adjustable current limiting/sensing circuit of claim 1, wherein said third input transistor comprises NPN transistor arranged as a common emitter amplifier circuit.

* * * * *